United States Patent [19]

Mather et al.

[11] Patent Number: 4,928,387
[45] Date of Patent: May 29, 1990

[54] TEMPORARY SOLDERING AID FOR MANUFACTURE OF PRINTED WIRING ASSEMBLIES

[75] Inventors: John C. Mather; Jerald A. Young, both of Cedar Rapids, Iowa

[73] Assignee: Rockwell International Corp., El Segundo, Calif.

[21] Appl. No.: 404,233

[22] Filed: Sep. 7, 1989

[51] Int. Cl.$^5$ ............................................. H05K 3/34
[52] U.S. Cl. .................................... 29/840; 174/263; 228/180.1
[58] Field of Search ....................... 29/840; 174/68.5; 228/180.1, 180.2; 428/901

[56] References Cited

U.S. PATENT DOCUMENTS

| | | | |
|---|---|---|---|
| 3,757,087 | 9/1973 | Bernard | 174/68.5 X |
| 3,967,162 | 6/1976 | Ceresa et al. | 174/68.5 X |
| 4,143,005 | 3/1979 | Packer . | |
| 4,208,005 | 6/1980 | Nate et al. . | |
| 4,215,025 | 7/1980 | Packer et al. | 29/840 X |
| 4,311,267 | 1/1982 | Lim . | |
| 4,314,870 | 2/1982 | Ishida et al. . | |
| 4,345,371 | 8/1982 | Ohsawa et al. . | |
| 4,398,660 | 8/1983 | Pampalone et al. . | |
| 4,635,346 | 1/1987 | Matsuzaki | 29/840 X |
| 4,642,889 | 2/1987 | Grabbe | 29/840 |
| 4,648,179 | 3/1987 | Bhattacharyya | 174/68.5 X |
| 4,668,565 | 5/1987 | Murachi . | |

FOREIGN PATENT DOCUMENTS 60-177953 2/1984 Japan .

OTHER PUBLICATIONS

Product Brochure, "YR-5414 Water Soluble Wave Solder Tape," 3M.

Primary Examiner—Carl J. Arbes
Attorney, Agent, or Firm—M. Lee Murrah; V. Lawrence Sewell; H. Fredrick Hamann

[57] ABSTRACT

Printed wiring boards using surface mount and other components are manufactured using a double-sided tape assembly. The tape assembly is composed of a soluble base layer coated on each side with an adhesive layer, and these layers are sandwiched between top and bottom protective release paper layers. Holes are formed in the tape assembly corresponding to the location of solder pads on the printed wiring board, and the tape assembly is adhered to the printed wiring board after removal of the bottom adhesive layer. Solder paste is applied to the top release layer, filling the holes in the tape assembly. The top release layer is removed, exposing the top adhesive layer, and the component is pressed onto the adhesive layer with its terminations in registry with the solder-filled holes. The board assembly is then soldered, and the remaining base and adhesive layers of the tape assembly are removed by action of a solvent during cleaning.

5 Claims, 1 Drawing Sheet

TEMPORARY SOLDERING AID FOR MANUFACTURE OF PRINTED WIRING ASSEMBLIES

BACKGROUND OF THE INVENTION

The invention relates to new and useful improvements in manufacturing printed wiring assemblies, and more particularly to installation of surface mount and other components on printed wiring boards.

Surface mounting of electronic components on printed wiring boards has become a significant mounting method for printed wiring assemblies used in high quality electronic equipment. This method offers opportunities for reliability and performance improvements of such assemblies and for increasing the efficiency of the manufacturing process. Surface mount technology is explained in an article in OST magazine, October, 1987, at page 15 et seq., which article is incorporated herein by reference.

Surface mount components are often soldered to printed wiring boards using vapor phase reflow or other techniques. In such techniques solder paste is applied to selected pads on the printed wiring board using screen printing or other techniques, and the components are positioned with their terminations atop the solder paste covered pads and are held in place by the paste. The assembly is then passed through a chamber containing the vapor phase of a liquid which has a vaporization temperature higher than the melting temperature of the solder. When the relatively cool printed wiring assembly enters the hot vapor, the vapor condenses onto the printed wiring board and thus heats the printed wiring board to the boiling point of the fluid. The solder is thus melted and joins to the component terminations, and the printed wiring assembly is passed into a cooling chamber where the solder solidifies into its final state.

Application of solder paste using current methods requires considerable effort. The screen printing method requires tedious and time consuming levelling and alignment of the screen printer in order to produce a good deposition pattern free from "skips," bridges and misalignment. Changes in the printed wiring assembly design, or in the amount of solder paste, dictate that a new screen or stencil be fabricated, causing increased expense. Since stencil fabrication is time consuming, long lead times are required.

Surface mounted components, especially small "chip" capacitors and resistors, have a tendency to move laterally and to "tombstone," or stand on end, during the soldering operation. Parts which have moved must be manually relocated, which not only consumes valuable time but also reduces the overall reliability of the assembly. Permanent adhesives have been used to secure components in place to prevent movement, but quality experts are concerned that such permanent adhesives may shorten solder joint fatigue life since such adhesives exhibit a relatively high thermal expansion rate and may add stress or strain to the solder joints during thermal cycling.

Related events also occur when leaded components are soldered to printed wiring boards. Wave soldering is the dominant machine process for soldering of leaded components into plated holes on printed wiring boards. During the wave soldering process, holes in the printed wiring board intended for use and soldering later in the assembly process may be filled with solder unless covered. This requires later reworking to allow insertion of component leads. This problem is typically alleviated by applying a temporary "solder stop" liquid to the board prior to the wave soldering process, which hardens after application and blocks the holes. The solder stop material is water or solvent soluble and is later removed during the board cleaning process. However, the use of such material is time-consuming, whether applied by hand or by automated equipment, and its brittleness, when dry, can lead to cracking and breakage before or during soldering.

In addition, other areas of a printed wiring board may be subject to bridging, shorts and other adverse effects due to exposure of the outside layer of circuitry to the wave of molten solder during the soldering process. To prevent these effects, a polymeric coating, or solder mask, is often applied to the board surface. This mask material is effective, but it is costly and adds weight to boards. In addition, it is subject to its own set of problems, such as misregistration, peeling, inadequate chemical resistance, discoloration and other quality related problems.

It is therefore an object of the present invention to provide a soldering aid which eliminates the need for applying permanent solder masks to the wave-solder side of printed wiring boards.

It is another object of the present invention to provide a soldering aid which temporarily holds down components during soldering to prevent movement and "tombstoning."

It is a further object of the present invention to provide a soldering aid which temporarily masks desired areas of the printed wiring board during soldering.

It is yet another object of the present invention to provide a soldering aid which eliminates the need for screen printing or stencilling solder paste onto printed wiring boards.

It is still another object of the present invention to alleviate solder joint fatigue failure by permitting components to be affixed to printed wiring boards with a controllable standoff distance.

SUMMARY OF THE INVENTION

Surface mount components are mounted upon and soldered to pads on a printed wiring board using a double-sided tape assembly. The tape assembly is sized to cover the printed wiring board surface and is composed of multiple layers. The tape assembly has a soluble middle base layer sandwiched between soluble adhesive layers on each side of the base layer. The adhesive layers are protected by a layer of release paper on each side of the tape assembly.

When ready to use, holes or openings are formed in the tape assembly at locations corresponding to the locations of the solder pads to which a component is to be soldered during the current operation. The bottom release layer is removed exposing the bottom adhesive layer, and the tape assembly is applied to the printed wiring board such that the holes are in registry with the solder pads. Solder paste is then applied to the top release layer, filling the holes in the tape assembly, and the top release layer is removed leaving short columns of solder paste protruding above the top adhesive layer by the thickness of the top release layer. The terminations of the surface mount components are then aligned with the appropriate solder paste covered pads, and each component is then pressed onto the top adhesive layer, securing it in the proper position with the terminations pressed into the solder paste protrusions. The board assembly is heated to melt the solder paste and then cooled to form the desired solder Joints between the component terminations and the solder pads. After soldering, the board assembly is washed using standard solvents, and the remaining base layer and adhesive layers are removed through a combination of dissolution and erosion, leaving the component standing a desired distance above the printed wiring board.

The thickness of the top release layer, the base layer and the two adhesive layers may be varied by the user to control component placement parameters. The combined thickness of the base layer and the adhesive layers is substantially equal to the desired standoff distance between the printed wiring board and the bottom of the component after assembly. The combined thickness of the base layer, adhesive layers and top release layer determines the depth of the solder paste deposit. The thickness of the top release layer can be chosen to provide the proper amount of solder paste protruding above the top adhesive layer to provide a good solder connection.

Another embodiment of the invention provides a temporary solder mask to prevent solder bridging and unintentional filling of component holes. In this embodiment a tape assembly of the general type described above, but having only one adhesive side, is used. Holes are formed in the tape assembly only in those areas where the application of solder is desired, and the tape assembly is applied to the printed wiring board after removal of the single release layer. After insertion of components, the board is wave soldered, after which the tape assembly is removed by dissolution.

BRIEF DESCRIPTION OF THE DRAWINGS

The invention may be more fully understood by reading the following description of a preferred embodiment of the invention in conjunction with the appended drawings wherein.

DETAILED DESCRIPTION OF A PREFERRED EMBODIMENT

Figure 1:
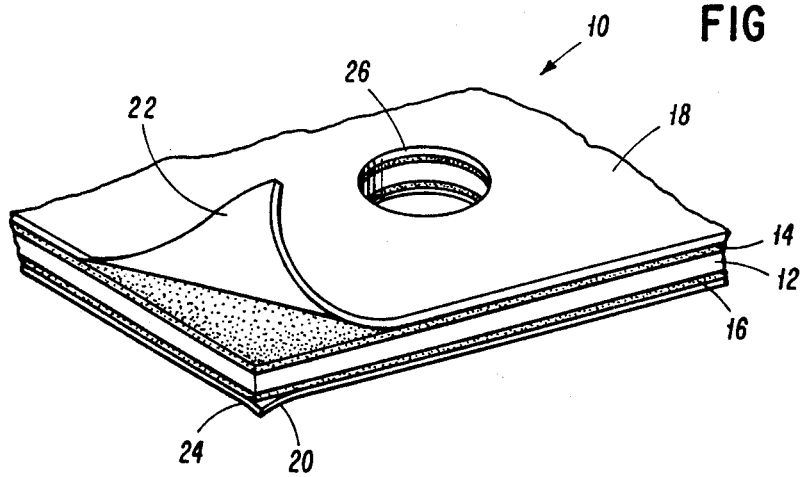
FIG. 1 is an isometric view of the double-sided tape assembly of the present invention.

The invention is especially suited for manufacturing printed wiring assemblies with surface mount, or leadless, components. The novel manufacturing process uses a double-sided tape assembly 10 as shown in FIG. 1. Tape assembly 10 is comprised of multiple layers, the centermost 12 which consists of a soluble base material. The thickness of base layer 12 is of variable thickness which is selected by the user. Base layer 12 is sandwiched between a top soluble adhesive layer 14 and a bottom soluble adhesive layer 16. Adhesive layers 14 and 16 are covered by a top release paper layer, or "backer," 18 and a bottom release paper layer, or backer, 20, both of which serve to protect the adhesive layers until the tape assembly is ready for use. The adhesion between adhesive layer 14 and backer 18 and between adhesive layer 16 and bottom backer 20 is such that both backers may be easily removed as suggested by bent corners 22 and 24 thereof, respectively. Bottom adhesive layer 16 is intended for application to the printed wiring board, and thus the thickness of bottom release paper layer 20 is not important. However, top release paper layer 18 is of variable thickness selected by the user as hereinafter described.

Base layer 12 and adhesive layers 14 and 16 are preferably soluble in water, but any other appropriate combinations of material and solvent may be used. Suitable materials for base layer 12 and adhesive layers 14 and 16 are those used in PX-361X water soluble tape manufactured by Permacel, New Brunswick, N.J. It is preferable that tape 10 also have a uniform thickness and be dimensionally stable to avoid alignment problems and non-ionic to prevent electrical shorts in case portions of the tape inadvertently remain on the board after cleaning. The thickness of base layer 12 and adhesive layers 14 and 16 determine the surface mount components' standoff height, which is the distance between the underside of the component and the surface of the printed wiring board and which is preferably equal to or greater than 0.005 inches. Preferable thickness for base layer 12 is greater than 0.003 inches, adhesive layer 14 is about 0.001 inches and adhesive layer 16 is about 0.001 inches. The combined thickness of base layer 12, adhesive layers 14 and 16, and top release paper layer 18 determines the depth of the solder paste deposit, which is preferably about 0.010 inches. Preferable thicknesses for the top release paper 18 is 0.005 inches. The combined thickness of base layer 12 and adhesive layers 14 and 16 is preferably approximately the same as the thickness of release layer 18 since the conversion of solder paste to solder involves about a 50% reduction in volume. However, it should be apparent that the actual thickness of the various portions of the tape can be tailored to meet the specific needs of the user, and the figures presented above constitute just one preferred example.

Tape assembly 10 is prepared for use by cutting it into a sheet slightly larger than the printed wiring board on which it will be used. Holes or openings, as illustrated by exemplary hole 26 in FIG. 1, are then formed in and through tape assembly 10, using methods well-known in the art, while backers 18 and 20 are still in place. References hereinafter to hole 26 in the singular should be understood to include other holes which may be formed in the tape assembly 10 as well. The holes are typically formed by cutting, using a laser cutting system which can use either a "black line" artwork image of the type formerly used to make screens for printing, or data downloaded from a printed wiring board design computer. The cutting process produces a stencil for use in the board assembly process, which can be made in bulk and stored for later use or produced at the point of use if design changes occur frequently. When the printed wiring board is ready for assembly, the bottom backer 20 is removed from tape assembly 10, and tape assembly 10, minus bottom backer 20, is applied to a printed wiring board 30 as shown on FIG. 2, such that hole 26 is in registry with solder pad 32 on board 30. Other holes in tape assembly 10 would likewise be positioned to be in registry with other solder pads on board 30. Pressure is normally applied to ensure complete adhesion by adhesive layer 16 to printed wiring board 30. Next solder paste 34 is applied into hole 26 with a "squeegee," or other suitable means, using surface of top backer 18 as a guide. Solder paste 34 completely fills hole 26 between solder pad 32 and the top of top backer 18 forming an enclosed column. Alternatively, the solder paste application process can be automated using a screen printer device without the normally used screen.

Figure 3A:
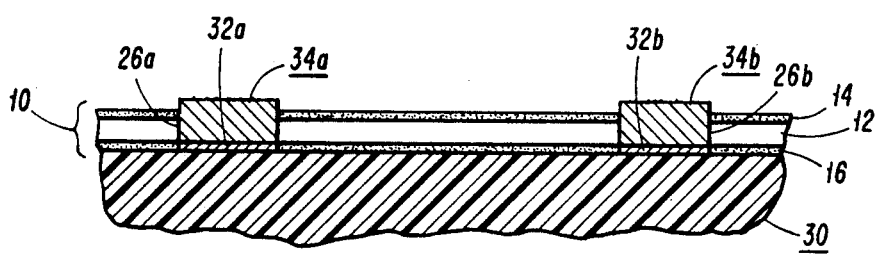
FIG. 3A is an elevational view of the double-sided tape assembly and printed wiring board as shown in FIG. 2 after removal of the top release paper layer.
Figure 3B:
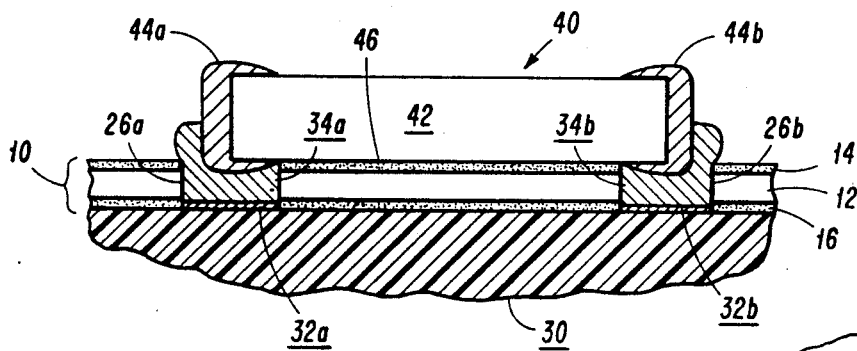
FIG. 3B is an elevational view of the double-sided tape assembly and printed wiring board as shown in FIG. 3A after placement of a surface mount component.

After application of the solder paste 34, top backer 18 is peeled away as shown in FIG. 3A. Both FIGS. 3A and 3B illustrate two holes 26a and 26b, in registry with solder pads 32a and 32b, and filled with solder paste 34a and 34b. When top backer 18 is removed, adhesive layer 14 is exposed and solder paste 34a and 34b are left extending above adhesive layer 14 at a height determined by the thickness of top backer 18. The thickness of top backer 18 is chosen to provide the optimum amount of solder paste extending above adhesive layer 14 to provide proper soldering without wastage of solder paste.

As shown in FIG. 3B, a surface mount component, or leadless chip, 40 having a body 42 with conductive terminations 44a and 44b attached on each side thereof and electrically connected to electronic elements inside body 42, is mounted atop tape assembly 10. Component 40 is placed with its terminations 44a and 44b in registry with solder paste columns 34a and 34b and is pressed downwardly, displacing the solder paste columns slightly, until the bottom 46 of component 40 contacts and is thus bonded to adhesive layer 14. The thickness of the combination of adhesive layers 14 and 16 and base layer 12 are chosen to position the bottom 46 of component 40 at the optimum distance from the top of printed wiring board 30. While the present invention is most advantageously used with surface mount components, it should be understood that it can also be used to advantage with regular leaded components. The printed wiring board is then soldered and cleaned. Base layer 12 and adhesive layers 14 and 16 are dissolved by the aqueous cleaning solution, which is typically comprised of water plus monoethanolamine saponifier.

It may be readily seen that tape assembly 10 performs all the functions of a solder paste screen or stencil as well as a component adhesive in one easily used, low cost and flexible package. The fixed volume of hole 26 provides for a controlled amount of solder paste which is always properly located directly above solder pad 32 and is contained to prevent movement or accidental dislocation of the solder paste after application. Component 40 is also bonded to adhesive layer 14 and thus to printed wiring board 30 in the proper location and alignment for soldering. This prevents component 40 from shifting or tombstoning either before or during soldering. In addition, the bottom 46 of surface mount component 40 is spaced at the desired distance from the top surface of printed wiring board 30. It is desirable to provide a greater standoff distance than is possible with current methods since the larger standoff distance promotes long solder joint life. The longer connection between component terminals and solder pads provides flexibility which helps reduce fatigue failure. With properly chosen thicknesses of the layers of tape assembly 10, component 40 can be positioned above board 30 at the optimum height and with the optimum interface with solder paste 34.

Figure 2:
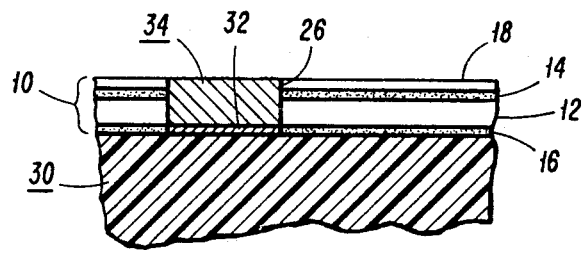
FIG. 2 is an elevational view of the double-sided tape assembly after being secured to the printed wiring board and application of solder paste.
Figure 4:
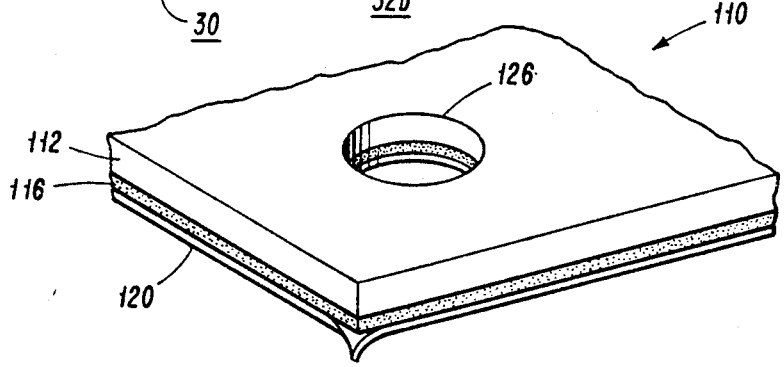
FIG. 4 is an isometric view of an embodiment of a single sided tape assembly of the present invention.

An alternative embodiment of the invention useful for standard leaded components is shown in FIG. 4, wherein the reference numerals are chosen such that the tens and units digits correspond to similar features in the embodiment of FIGS. 1–3. This embodiment uses a tape assembly 110 comprised of a soluble base layer 112 having a soluble adhesive layer 116 on the bottom side thereof protected by a backer 120. Unlike the previously described embodiment, the top side of base layer 112 is not covered by an adhesive or backer, and while the overall tape assembly will be as thin as possible, the thickness of the individual layers is not critical. The total thickness of the base and adhesive layers is preferably 0.0015 inches or smaller, the exact thickness depending upon hole diameter. As with the previous embodiment, tape assembly 110 has holes, as illustrated by hole 126, formed therein.

The embodiment of FIG. 4 is used by cutting a sheet of the tape assembly 110 slightly larger than the printed wiring board being soldered and forming holes 126 therein by any one of several well-known methods to correspond to the areas of the printed wiring board to be soldered. Backer 120 is removed, and the tape is applied to the solder wave side of the printed wiring board, to which it is adhered by adhesive layer 116. Components are then inserted into the printed wiring board, and the board is wave soldered in those areas exposed through hole 126. Use of tape assembly 110 as a mask prevents bridging of conductors, and prevents solder from filling unused holes in printed wiring board 110. The remaining base layer 112 and adhesive layer 116 of tape assembly 110 are dissolved and completely removed during the aqueous cleaning step following soldering. The use of the soluble tape assembly eliminates the need to use a solder stop. In addition, it provides the same benefits as a permanent polymeric solder mask, but its easy removability reduces the weight and cost of the completed printed wiring board. The weight reduction can provide a substantial advantage in printed wiring boards that are used in airborne or other weight sensitive applications. The elimination of the polymeric solder mask eliminates costly rework necessitated by severe quality control problems associated with the maskant and/or masking process.

While particular embodiments of the present invention have been shown and described, it should be clear that changes and modifications may be made to such embodiments without departing from the true scope and spirit of the invention. It is intended that the appended claims cover all such changes and modifications.

I claim:

1. Method of attaching a surface mount component to a printed wiring board having a multiplicity of solder pads positioned thereon to receive the terminations on the component, comprising the steps of:

providing a mask blank coextensive with the printed wiring board, comprising a base layer material coated on both top and a bottom sides with an adhesive layer and protected by a coextensive backing on both top and bottom sides thereof, the combined thickness of the base layer and the adhesive layers being equal to desired standoff distance between said printed wiring board and said component;

selectively forming openings through the mask blank, sized and positioned to correspond to the locations of selected ones of the solder pads;

removing said backing from the bottom side of said mask blank to expose the underlying bottom adhesive layer;

applying said mask blank with said exposed adhesive layer to said printed wiring board, positioned with the openings therein in registry with said solder pads;

filling said holes with solder paste;

removing said backing from the top side of said mask blank to expose the top underlying adhesive layer;

positioning said surface mount component onto said exposed top adhesive layer with its terminations over said paste filled holes to form a printed wiring board assembly;

heating said printed wiring board assembly to melt said solder paste into a solder mass; and cooling said printed wiring board assembly to solidify said solder mass.

2. The method of claim 1 wherein said base layer and said adhesive layers are soluble in a cleaning solution, and further including the step of immersing said printed wiring board assembly in the cleaning solution to dissolve said base layer and adhesive layers.

3. The method of claim 2 wherein said cleaning solution is water.

4. Method of soldering a printed wiring board, comprising the steps of:

providing a mask blank coextensive with the printed wiring board, comprising a soluble base layer material coated on one side with a soluble adhesive layer protected by a coextensive backing thereon;

selectively forming holes through the mask blank, sized and positioned to correspond to portions of said printed wiring board on which solder coverage is desired;

removing said backing from said one side of said mask blank to expose the underlying adhesive layer;

applying said exposed adhesive layer of said blank mask to the trace side of said printed wiring board, positioned with the holes therein in registry with areas of said printed wiring board on which solder coverage is desired;

wave soldering said printed wiring board; and immersing said printed wiring board assembly in a solvent to dissolve said base layer and adhesive layers.

5. The method of claim 4 wherein said solvent is water.

* * * * *